United States Patent [19]

Henderson et al.

[11] 4,387,401

[45] Jun. 7, 1983

[54] CARRIER DETECTOR APPARATUS USEFUL IN A MULTIBAND SWEEP TYPE TUNING SYSTEM

[75] Inventors: John G. N. Henderson, Princeton; Robert J. Maturo, Bricktown, both of N.J.

[73] Assignee: RCA Corporation, New York, N.Y.

[21] Appl. No.: 305,688

[22] Filed: Sep. 25, 1981

Related U.S. Application Data

[60] Continuation-in-part of Ser. No. 170,997, Jul. 21, 1980, abandoned, which is a division of Ser. No. 43,765, May 30, 1979, Pat. No. 4,254,506.

[51] Int. Cl.³ .......................... H04N 5/44; H03J 7/02
[52] U.S. Cl. ............................ 358/193.1; 358/195.1; 455/164
[58] Field of Search ............... 455/161, 164, 169, 263; 358/193.1, 195.1

[56] References Cited

U.S. PATENT DOCUMENTS

| | | | |
|---|---|---|---|
| 3,936,753 | 2/1976 | Clark | 455/164 |
| 4,214,274 | 7/1980 | Rzeszewski et al. | 358/193.1 |
| 4,217,552 | 8/1980 | Mogi et al. | 455/164 |
| 4,302,778 | 11/1981 | Tanaka | 358/195.1 |

OTHER PUBLICATIONS

SGS/ATES Data Sheets for the M193 and TDA4430 Integrated Circuits.
"A Microcomputer-Controlled Frequency Synthesizer for T.V." by Rzeszewski et al., IEEE Transactions on Consumer Electronics, May 1978, vol. CE-24, No. 2, pp. 145-154.

Primary Examiner—Jin F. Ng
Attorney, Agent, or Firm—E. M. Whitacre; P. J. Rasmussen; P. M. Emanuel

[57] ABSTRACT

In a sweep type tuning system capable of sweeping through a desired range of carrier frequencies selectively in one of two directions, a carrier detector includes a discriminator for generating a discriminator signal as the frequency range is swept which has a first amplitude portion when the frequency of a tuned carrier is less than a predetermined nominal value and a second amplitude portion when the frequency of the tuned carrier is greater than the predetermined nominal value. A sequence detector determines the sequence of generation of the first and second portions of the discriminator signal to generate a signal indicating the presence of the tuned carrier. The presence indicating signal is generated when the sweeping takes place in a first direction if the first and then the second portions are sequentially generated and when the sweeping takes place in the second direction if the second and then first portion are sequentially generated.

15 Claims, 15 Drawing Figures

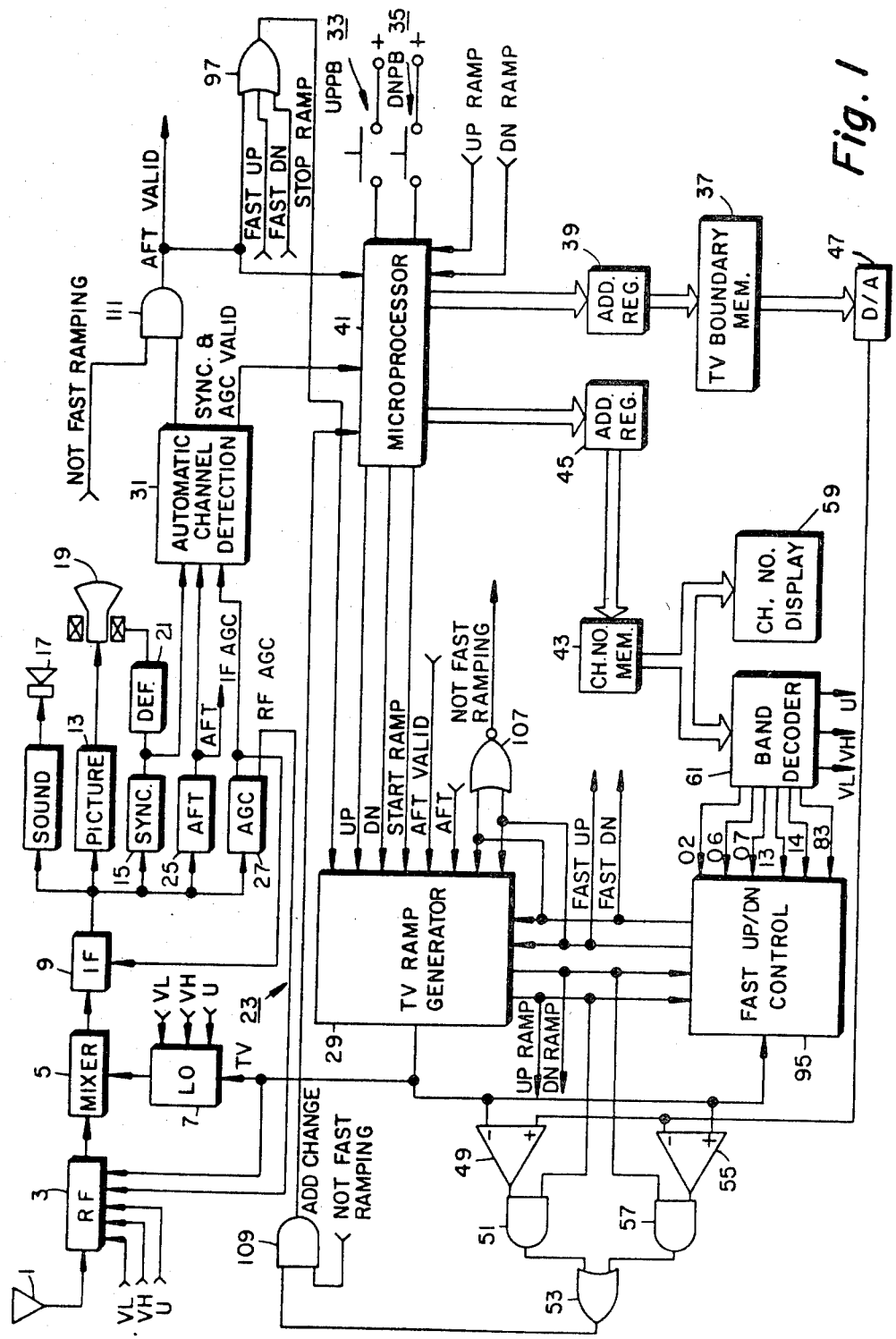

CARRIER DETECTOR APPARATUS USEFUL IN A MULTIBAND SWEEP TYPE TUNING SYSTEM

BACKGROUND OF THE INVENTION

This application is a Continuation-in-Part of application Ser. No. 170,997, filed July 21, 1980, now abandoned. The latter application is a Division of application Ser. No. 043,765, filed May 30, 1979, now U.S. Pat. No. 4,254,506.

The present invention relates to the field of digital tuning systems.

A number of digital tuning systems for controlling a voltage controlled oscillator to generate a local oscillator signal for tuning a radio or television receiver are known. These digital tuning systems may be generally categorized as being either of the frequency synthesizer, voltage synthesizer or voltage sweep type.

Frequency synthesizers are typically closed loop. One type of frequency synthesizer includes a phase or frequency comparator for generating the control voltage for a local oscillator signal by comparing the phase and/or frequency of a variable frequency signal derived by the frequency division of the local oscillator signal and a relatively stable reference frequency signal. The frequency of the loop and thereby the frequency of the local oscillator signal is determined by division factors of fixed and programmable frequency dividers in the loop. The programmable divider is controlled in response to binary signals representing the number of a selected channel to determine the particular local oscillator frequency. Another type of frequency synthesizer includes a counter for counting in cycles of a voltage controlled local oscillator signal and a count comparator for comparing the number accumulated by the counter with a number derived from binary signals representing the channel number of a selected channel to develop a local oscillator control voltage. In either system channel numbers of selected channels can be readily displayed in response to the binary signals representing the number of the selected channels. Although such frequency synthesizers are advantageous in that the frequencies of the local oscillator signal are relatively accurate because of the closed loop nature of the systems, such systems are relatively expensive due to the cost of the high speed dividers and counters they necessarily employ.

Voltage synthesizers are typically open loop systems and generally include a memory having a plurality of tuning voltage memory locations for storing binary signals representing the tuning voltages for each of the channels that a user may select. The channel numbers of selected channels can be readily displayed, for example, in response to binary signals representing the channel numbers and utilized to address corresponding tuning voltage memory locations. Although such voltage synthesizers are advantageous in that they are relatively inexpensive compared with frequency synthesizers because they do not require high speed frequency dividers and counters, they tend to be less accurate because the required precision and resolution in converting the binary signals stored in the tuning voltage memory locations to the corresponding tuning voltages is not readily attainable in open loop systems.

Many tuning systems of the voltage sweep type are known. Basically, they all generate a ramp-like tuning voltage which is utilized to sweep the frequency of the local oscillator signal. In its simplest form, the magnitude of the tuning voltage is increased or decreased under user control by means of a potentiometer or the like until the user determines that an acceptable station has been reached. Signal sweeping systems are also known in which the magnitude of a tuning voltage is changed until a carrier is automatically detected. Such sweep systems are advantageous in that they are relatively accurate compared to voltage synthesizers since the tuning voltage is continuously adjusted until an acceptable channel is located and are relatively inexpensive compared to frequency synthesizers since they do not require high speed frequency dividers and counters. However, since the tuning voltage is not derived as part of an operation involving the use of binary signals representing the number of a selected channel, additional apparatus must be provided for channel identification.

Related U.S. Pat. Nos. 4,317,225 and 4.254,506 both filed on May 30, 1979 and both assigned like the present application to RCA Corporation, disclose channel identification apparatus for a voltage sweep type tuning system in which the magnitude of the tuning voltage is compared with boundary voltages having magnitudes corresponding to magnitudes of the tuning voltage at frequencies between the tuning voltage ranges associated with respective adjacent channels which are stored in respective memory locations of a memory. The present invention concerns a carrier detector useful in a voltage sweep type tuning system. A preferred embodiment of the present invention is described, by way of example, with reference to the same voltage sweep type tuning system disclosed in the above identified related U.S. patents.

SUMMARY OF THE PRESENT INVENTION

The present invention concerns a carrier detector for a sweep type tuning system which indicates the presence of a carrier as a predetermined frequency range is swept when amplitude portions of a discriminator signal are generated in a predetermined sequence related in a predetermined manner to the sweep direction. Specifically it employs discriminator means responsive to an IF signal for generating a discriminator signal as the frequency range is swept which has a first amplitude portion when the frequency of an IF signal is less than a predetermined nominal value and a second amplitude portion when the frequency of the IF signal is greater than the predetermined nominal value. A sequence detector determines the sequence of generation of the first and second amplitude portions of the discriminator signal to generate a signal indicating the presence of the tuned carrier when the sequence is related in a predetermined manner to the sweep direction. In tuning systems of the type in which the sweep is selectively conducted in either a first or second direction, the presence indicating signal is generated when the sweeping takes place in a first direction if the first and then the second portion are sequentially generated and when the sweeping takes place in the second direction if the second and then the first portion are sequentially generated.

BRIEF DESCRIPTION OF THE DRAWINGS

FIGS. 1, 1a, 1b and 1c, which should be referred to concurrently, show, partially in block diagram form and partially in schematic diagram form, a sweep type tuning system for a television receiver which may employ the present invention.

DETAILED DESCRIPTION OF THE DRAWING

Figure 1A:
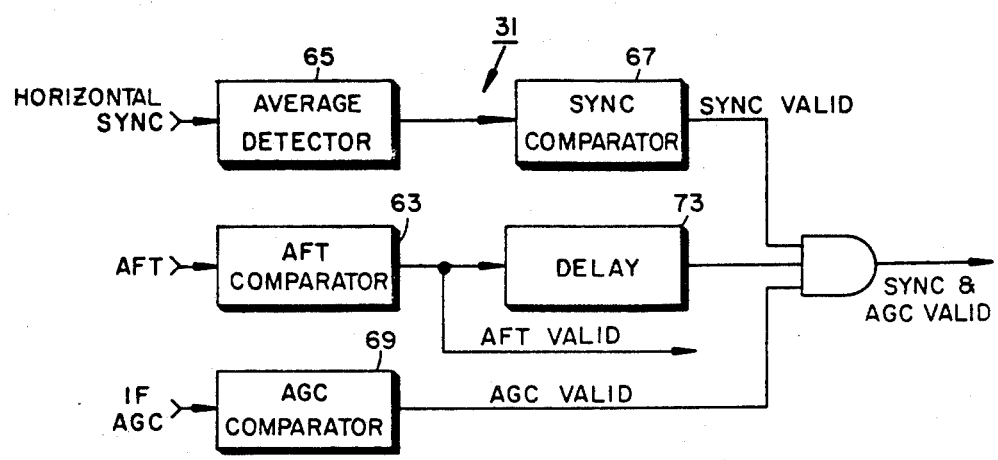

The color television receiver shown in FIG. 1 includes an antenna 1, an RF processing unit 3, a mixer 5 and a voltage controlled local oscillator 7 arranged to generate an IF signal. The IF signal is processed by an IF processing unit 9 and coupled to a sound processing unit 11, a picture processing unit 13 and a synchronization unit 15. An audio response is generated by a speaker 17 in response to audio signals derived from the IF signal by sound processing unit 11. Electron beams representing red, green and blue information are generated by a picture tube 19 in response to picture signals derived from the IF signal by picture processing unit 13. The electron beams are deflected in a raster portion to form an image in response to horizontal and vertical synchronization signals generated by a deflection unit 21 in response to horizontal and vertical synchronization pulses derived from the IF signal by synchronization unit 15.

Local oscillator 7 includes tuned circuit configurations (not shown) for each of a low VHF band covering channels 2 through 6, a high VHF band covering channels 7 through 13 and a UHF band covering channels 14 through 83. The tuned circuits are selectively activated in response to VL (VHF Low), VH (VHF High) and U (UHF) band selection signals generated by a tuning system 23 which is constructed in accordance with the present invention. Each of the tuned circuit configurations includes an inductor and varactor diode (not shown). The varactor diode is reverse biased by a tuning voltage generated by tuning system 23 to exhibit a capacitance. The magnitude of the tuning voltage determines the capacitance of the tuned circuit and thereby the frequency of local oscillator 23. The band selection signals and the tuning voltage are also coupled to RF unit 3 to control selectively enabled tuned circuit configurations similar to the ones in local oscillator 7 so as to track the tuning of local oscillator 7.

A portion of the IF signal is coupled to an automatic fine tuning (AFT) discriminator 25 which generates an AFT signal having a magnitude representing the magnitude of the deviation of the frequency of a picture carrier component of the IF signal from its nominal value, 45.75 MHz. The AFT signal is utilized by tuning system 23 as will be described below to develop the tuning voltage. The IF signal is also coupled to an automatic gain control (AGC) unit 27 which generates RF and IF AGC signals for controlling the gains of the RF and IF stages, respectively, in accordance with the RF signal strength as manifested by the amplitude of the IF signal.

The portions of the receiver shown in FIG. 1, with the exception of tuning system 23, are conventional and may therefore comprise corresponding portions of a CTC-93 television chassis manufactured by RCA Corporation and described in detail in "RCA Service Data, File 1978 C-7", hereby incorporated by reference.

Tuning system 23 is of the sweep/signal seeking type described above and includes a ramp voltage generator 29 and automatic channel detection circuits 31. When a user depresses either an up push button (UPPB) 33 or a down push button (DNPB) 35, ramp voltage generator 29 generates a ramp voltage which increases or decreases, respectively, as a function of time until automatic channel detection circuits 31 detect the presence of a channel acceptable for viewing.

A channel identification arrangement displays the channel number of the first acceptable channel to which tuning system 23 tunes the receiver after one of UPPB 33 or DNPB 35 are depressed and also the channel numbers of the channels passed to reach the first acceptable channel. In the latter manner, the user is made aware, during periods in which an acceptable channel is sought, that tuning system 23 is operating. This is a desirable feature since acceptable channels, especially in the UHF band, may be considerably separated.

The channel identification arrangement includes a tuning voltage boundary memory 37 having memory locations for storing binary signals representing boundary voltages having magnitudes corresponding to the lowest and highest magnitude of a tuning voltage range corresponding to each of channels 2 through 83 to which tuning system 23 may tune the receiver. Tuning voltage boundary memory 37 comprises a PROM (Programmable Read Only Memory) for reasons which will be explained below. A tuning voltage boundary memory address register 39 addresses memory locations of tuning voltage boundary PROM 37 under the control of a microprocessor 41. The channel identification arrangement also includes a channel number memory 43, comprising a ROM (Read Only Memory), having memory locations for storing binary signals representing channel numbers 02 through 83 and a channel number address register 45 for addressing the memory locations of memory 43 under the control of microprocessor 41.

As memory locations of memory 37 are addressed, a digital-to-analog converter 47 generates the boundary voltages in response to the stored binary signals. When the tuning voltage is swept in the direction of increasing magnitudes, the upper boundary voltages are compared to the tuning voltage by an UP voltage comparator 49. As long as an acceptable channel is not detected, whenever the magnitude of the tuning voltage exceeds the magnitude of an upper boundary voltage, an ADD (ADDress) CHANGE signal is generated by UP comparator 49 and coupled through an AND gate 51, enabled by an UP RAMP signal, and an OR gate 53 to microprocessor 41. In response, microprocessor 41 causes tuning voltage address register 39 to address the memory location of tuning voltage boundary memory 37 corresponding to the upper boundary voltage for the next higher channel and causes channel number address register 45 to address the memory location of channel number memory 43 corresponding to the same next higher channel. When the tuning voltage is swept in the direction of decreasing magnitudes, the lower boundary voltages are compared to the tuning voltage by a DN voltage comparator 55. As long as an acceptable channel is not detected, whenever the magnitude of the tuning voltage falls below the magnitude of a lower boundary voltage, an ADD CHANGE signal is generated by DN comparator 55 and coupled through an AND gate 57, enabled by a DN RAMP signal, and OR gate 53 to microprocessor 41. In response to the ADD CHANGE signal, microprocessor 41 causes tuning voltage boundary address register 39 to address the memory location of tuning voltage boundary memory 37 corresponding to the lower boundary voltage for the next lower channel and causes channel number address register 45 to address the memory location of channel number memory 43 corresponding to the channel number for the same next lower channel.

As the memory locations of channel number memory 43 are addressed, a two-digit channel number display unit 59, which may include two arrays of seven-segment light-emitting diodes each arranged in a conventional manner to display numbers, displays the corresponding channel number. In addition, a band decoder 61 examines the channel number to determine which of the low VHF, high VHF or UHF bands it is in to generate the VL, VH and U band selection signals.

An acceptable channel is detected by examining the magnitude of the AFT signal, the average value of the horizontal synchronization pulses, and the magnitude of the AGC signal coupled to the IF. For this purpose, automatic channel detection circuits 31 (see FIG. 1a) includes: an AFT voltage comparator 63 for generating an AFT VALID signal when the magnitude of the AFT signal is between predetermined threshold values defining its control range; an average detector 65 and average synchronization voltage comparator 67 for generating a SYNC VALID signal when the average voltage of the horizontal synchronization pulses is within a predetermined range of values; and an AGC voltage comparator 69 for generating an AGC VALID signal when the IF AGC is below a predetermined threshold.

The AFT signal is examined to determine the presence of an IF carrier. The carrier detected may be that of the sound component of the IF signal rather than that of the picture carrier. Under these conditions, the average voltage of the synchronization pulses will not be within the predetermined range established by average synchronization voltage comparator 67. Thus, the synchronization pulses are examined to prevent tuning system 23 from tuning the receiver to a sound carrier rather than a picture carrier. The IF AGC signal is examined so that the receiver will not be tuned to carriers having insufficient signal strength to produce a picture without an undue amount of interference or "snow" as it is sometimes called in the picture. Since the amount of interference which is tolerable is dependent on the particular user's preferences, AGC comparator 69 may include a potentiometer or the like for adjusting the predetermined threshold voltage to which the IF AGC signal is compared. The IF AGC signal rather than the RF AGC signal is utilized since the RF AGC in conventional color television receivers remains substantially constant until the signal strength is appreciable.

The AFT VALID signal is coupled to ramp voltage generator 29. The SYNC VALID and AGC VALID signals are combined by an AND gate 71 and coupled to microprocessor 41 but only after a predetermined time delay, determined by a delay unit 73, after the generation of the AFT VALID signal. The predetermined time delay is selected to allow synchronization unit 15 and AGC unit 27 to have time to settle after a carrier is detected.

Ramp voltage generator 29 (see FIG. 1b) includes a differential amplifier 75 and a capacitor 77 configured as a voltage integrator. A number of transmission gates have their conduction controlled in response to control signals generated by automatic channel detection circuits 31 and microprocessor 41 to start and stop the generation of the ramp tuning voltage and control the direction in which its magnitude is changed.

An UP pulse is generated by microprocessor 41 when:

(1) a power up detector 76 detects that the receiver has been turned on by sensing the level of one of the receiver's power supply voltages;

(2) UPPB 33 is depressed;

(3) an AFT VALID signal has not been generated during an upward search; and (4) an AFT VALID signal has been generated but SYNC VALID and AGC VALID signals have not been generated during an upward search.

A DN pulse is generated when:

(1) DNPB 35 is depressed;

(2) an AFT VALID signal has not been generated during a downward search; and (3) an AFT VALID signal has been generated but SYNC VALID and AGC VALID signals have not been generated during a downward search.

When either an UP pulse or a DN pulse is generated, a START RAMP pulse is also generated by microprocessor 41. As will be explained in detail with reference to FIGS. 8, 9 and 10, the START RAMP pulse has a predetermined duration set to facilitate the detection of RF carriers with the correct characteristics.

The START RAMP pulse sets a set-reset flip-flop (S-R FF) 78 thereby causing the conduction of a transmission gate 79. The UP pulse is coupled through an AND gate 81, enabled by the simultaneous presence of the START RAMP pulse, to the S input of a S-R FF 83. As a result, S-R FF 83 is set and thereby an UP RAMP signal is generated. The UP RAMP signal causes the conduction of a transmission gate 85. By virtue of the conduction of transmission gate 79 and 85, a positive voltage V is coupled to the noninverting (+) input of differential amplifier 75 through a resistor 87 and the magnitude of the tuning voltage is caused to increase or ramp up. The DN pulse is coupled through an AND gate 89, enabled by the simultaneous presence of the START RAMP pulse, to the R input of S-R FF 83. As a result, S-R FF 83 is reset and a DN RAMP signal is thereby generated. The DN RAMP signal causes the conduction of transmission gate 91. By virtue of the conduction of transmission gates 79 and 91, positive voltage V is coupled to the inverting (−) input of differential amplifier 75 through a resistor 93 and the magnitude of the tuning voltage is caused to decrease or ramp down.

The UP RAMP and DN RAMP signals are coupled to AND gates 51 and 53, respectively, to enable the appropriate one of UP voltage comparator 49 or DN voltage comparator 55 and to microprocessor 41.

Figure 2:
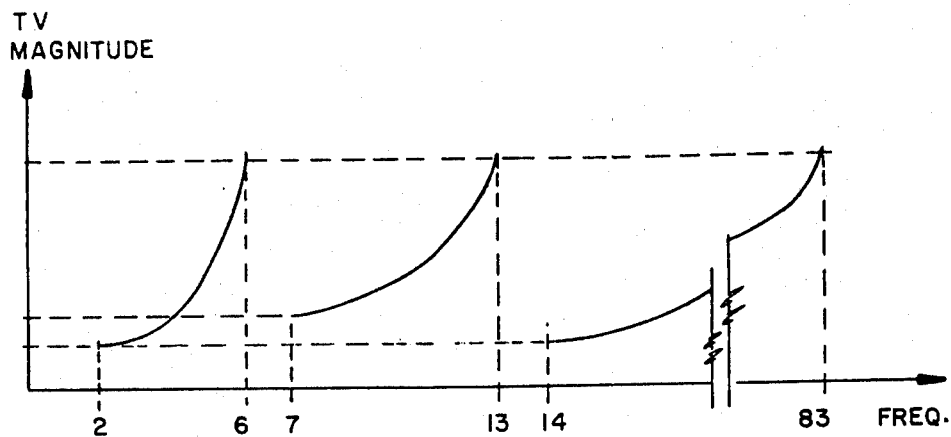
FIG. 2 shows tuning voltage characteristics of a voltage controlled tuner that may be employed in the tuning system of FIGS. 1, 1a, 1b and 1c useful in facilitating its understanding.

The tuning voltage versus frequency characteristics for television receivers employing varactor diodes over the entire VHF and UHF tuning range is not continuous and includes overlapping portions as is indicated in FIG. 2. That is, the magnitude of the tuning voltage for channe 6 is higher than the magnitude of the tuning voltage for channel 7, and the magnitude of the tuning voltage for channel 13 is higher than the magnitude of the tuning voltage for channel 14. Accordingly, it is desirable to cause the magnitude of the tuning voltage to be rapidly changed from the magnitude corresponding to the end of one band to the magnitude corresponding to the beginning of the next band in both the upward and downward ramping directions. A fast UP/DN control unit 95 is responsive to signals representing channels 2, 6, 7, 13, 14 and 83, i.e., the channels at the boundaries of the various bands, generated by band decoder 61 to generate a FAST DN signal in the upward ramping direction and a FAST UP signal in the downward ramping direction when the end of a band is reached.

Either of the FAST UP or FAST DN signals cause an OR gate 97 to generate a STOP RAMP signal. The STOP RAMP signal resets S-R FF 78 and causes transmission gate 79 to be rendered nonconductive. The FAST DN signal causes a transmission gate 99 to be rendered conductive, thereby coupling positive voltage V to the inverting (−) input of differential amplifier 75 through a resistor 101 having a lower resistance value than resistors 87 and 93 (used for normal ramping). As a result, in the upward ramping direction, the magnitude of the tuning voltage is relatively rapidly decreased between bands. The FAST UP signal causes a transmission gate 103 to be rendered conductive, thereby coupling a positive voltage V to the noninverting (+) input of differential amplifier 75 through a resistor 105 having a lower resistance than resistors 87 and 93. As a result, in the downward ramping direction, the magnitude of the tuning voltage is relatively rapidly increased between bands.

The UP RAMP and DN RAMP signals are coupled to AND gates 51 and 53, respectively, to enable the appropriate one of UP voltage comparator 49 or DN voltage comparator 55, and to microprocessor 41.

When the magnitude of the tuning voltage corresponding to the beginning of the next band is reached by fast ramping in either the downward or upward direction, fast UP/DN detector 95 terminates the appropriate one of the FAST UP or FAST DN signals.

During the fast ramping intervals, tuning system 23 is disabled from responding to either the ADD CHANGE or the AFT VALID signals by means of NOR gate 107, AND gate 109 and AND gate 111 since the tuning voltage generated during these intervals changes in the wrong direction.

During the normal ramping intervals, if an AFT VALID signal is generated, a STOP RAMP signal is generated by OR gate 97. In response, S-R FF 78 is reset and transmission gate 79 is rendered nonconductive to terminate ramping. In addition, in response to the AFT VALID signal, transmission gates 113 and 115 are rendered conductive, thereby coupling a portion of the positive voltage V to the inverting (−) input of differential amplifier 75 as a reference voltage and a portion of the AFT discriminator signal to the non-inverting (+) input of differential amplifier 75. Since any change in the tuning voltage, such as for example may be caused by the leakage of charge from capacitor 77, causes a corresponding change in the AFT signal applied to differential amplifier 75, the tuning voltage is maintained substantially constant.

Microprocessor 41 controls the operation of tuning system 23 primarily by controlling the addressing of tuning voltage boundary memory 37 and channel number memory 43. Microprocessor 41 (see FIG. 1c) includes input ports for receiving various input signals generated within tuning system 23, a central processing unit (CPU) 119 for evaluating the input signals, and output ports 121 for coupling output signals generated by CPU 119 in response to the input signals to various portions of tuning system 23. The output signals generated by CPU 119 are determined by a program permanently stored in memory locations of a RAM (Random Access Memory) 123 and addressed by a RAM address register 125 under the control of CPU 119 as the program is executed.

Figure 3:
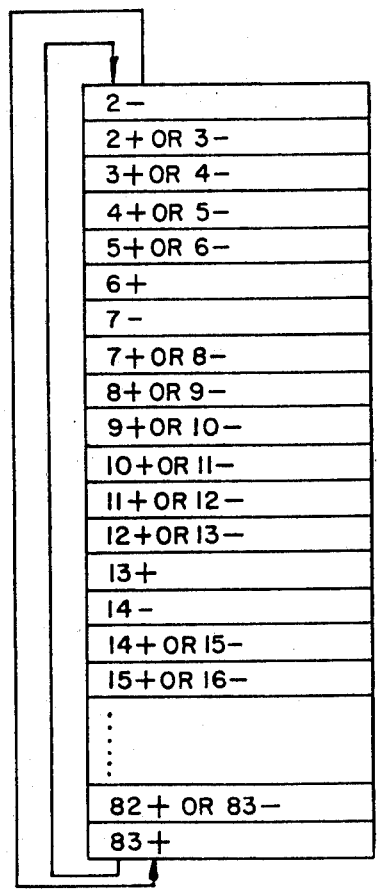
FIG. 3 shows the allocation of memory locations of a boundary voltage memory employed in the tuning system of FIGS. 1, 1a, 1b and 1c.

Before describing the program stored in RAM 123, it will be helpful to examine the arrangement of the memory locations of tuning voltage boundary memory 37 as shown in FIG. 3. Within a band, the boundary voltages stored in memory 37 have magnitudes substantially equal to the magnitudes of the tuning voltage at frequencies midway between the nominal frequencies of the picture carriers of adjacent channels. As a result, each of these boundary voltages represents the end of the tuning voltage range for one channel and the beginning of the tuning voltage range for the next channel. Thus, for example, in the low VHF band the boundary voltages indicated by 2+, 3+, 4+ and 5+ correspond to the highest magnitude of tuning voltage range for channels 2, 3, 4 and 5, respectively, as well as the lowest magnitude of the tuning voltage range for channels 3, 4, 5 and 6, respectively, and are therefore also identified by 3−, 4−, 5− and 6−, respectively. In addition, a boundary voltage having a magnitude substantially equal to the lowest magnitude of the tuning voltage for the lowest channel in each band, e.g., 2−, and a boundary voltage having a magnitude substantially equal to the highest magnitude of the tuning range for the highest channel in each band, e.g., 6+, are stored in memory locations of memory 37. The boundary voltages and channel numbers are stored in consecutive order in memories 37 and 43, respectively. As indicated in FIG. 3, the memory locations of memories 37 and 43 are addressed in continuous circular or "wrap around" fashion in both ramping directions.

Figure 4A:
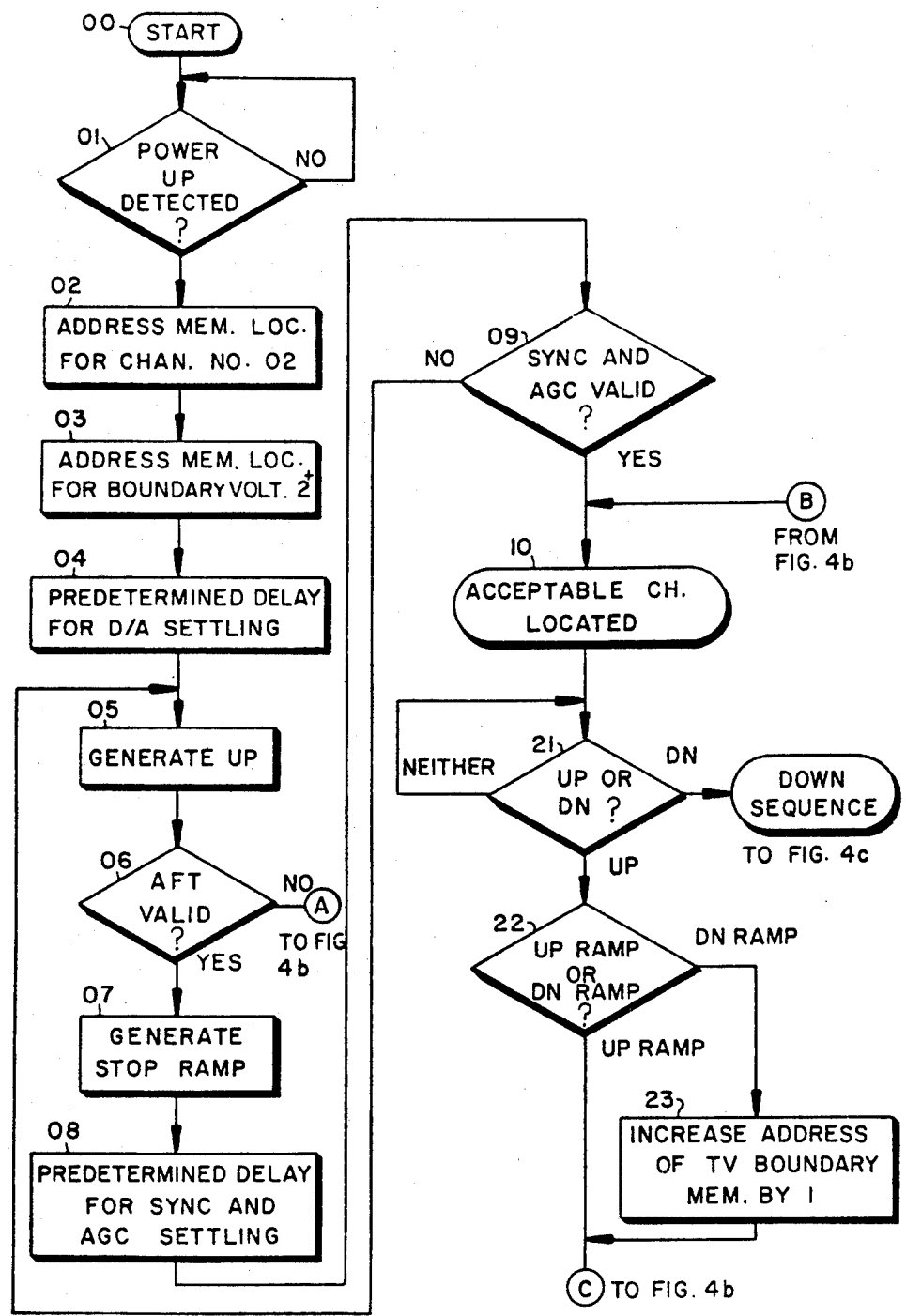
FIGS. 4a, 4b and 4c show a flow chart indicating the operation of the tuning system of FIGS. 1, 1a, 1b and 1c.
Figure 4B:
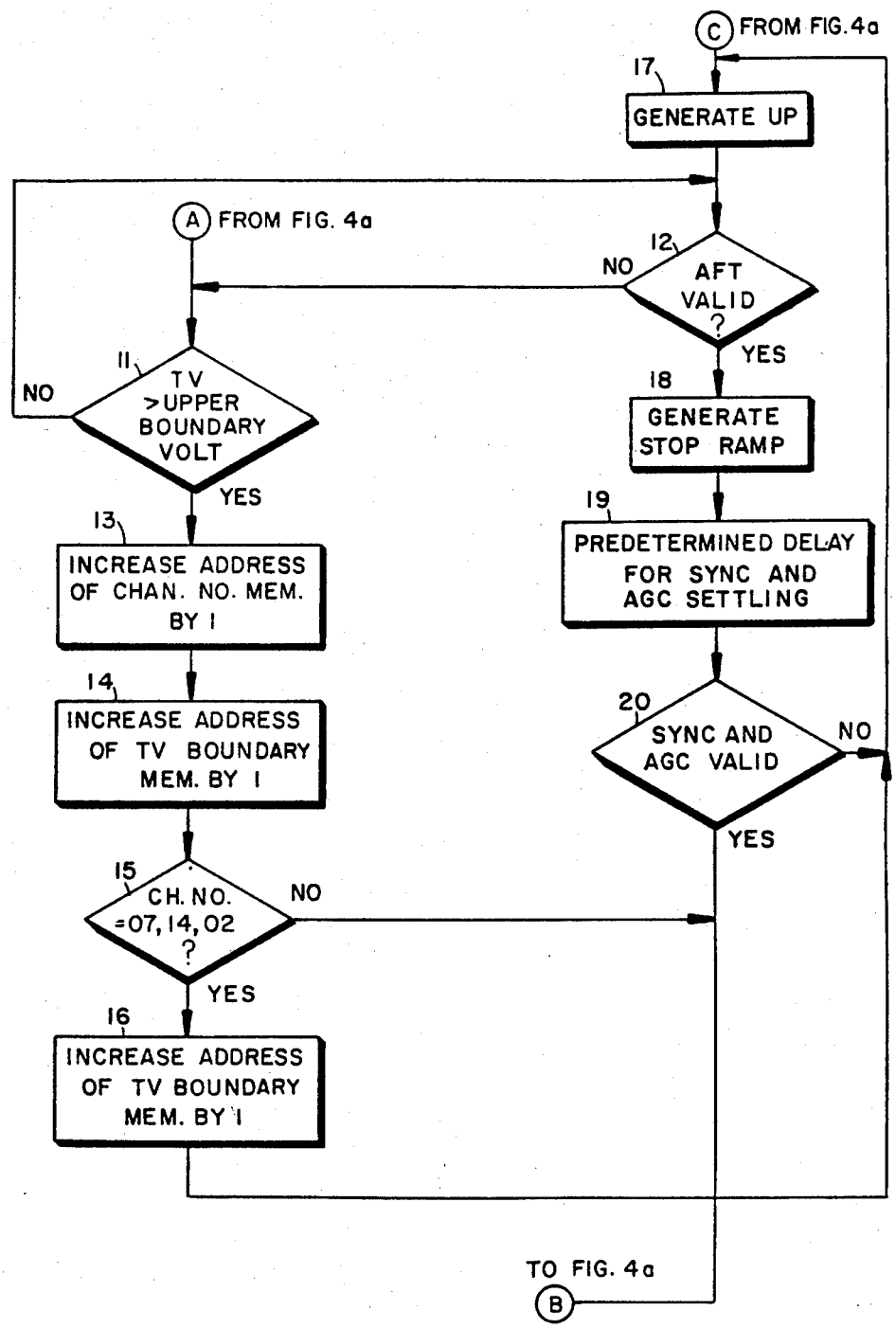
Figure 4C:
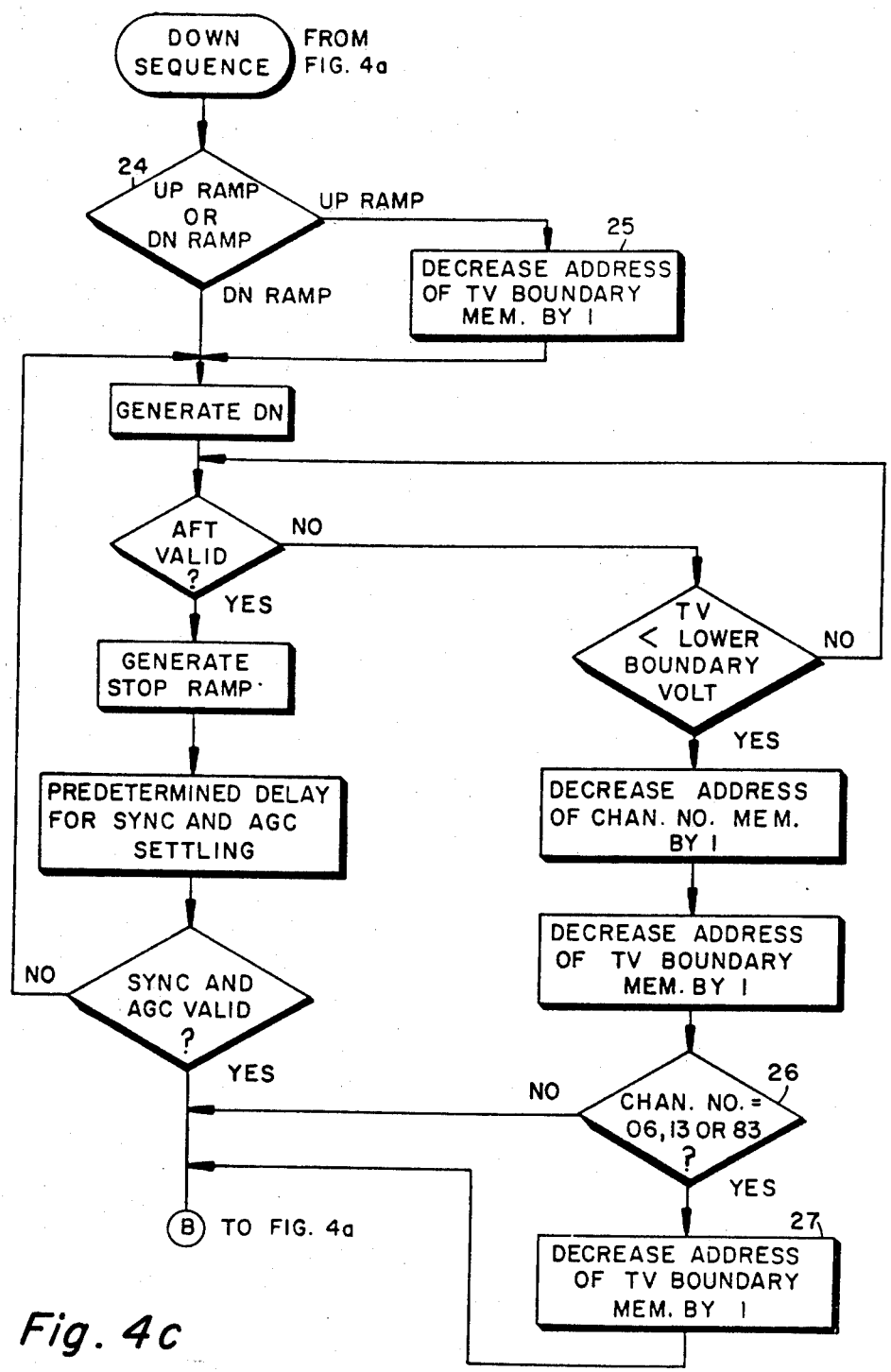

The flow chart of the program stored in RAM 123 for controlling tuning system 23 is indicated in FIGS. 4a, 4b and 4c. Since the program stored in RAM 123 is utilized primarily to control the addressing of memories 37 and 43, the flow chart of FIGS. 4a, 4b and 4c does not indicate certain operations of tuning system 23, such as fast up and down ramping, which are controlled by portions of tuning system 23 outside of microprocessor 41. However, where considered helpful in facilitating an understanding in the overall operation of tuning system 23, certain operations of tuning system 23, such as the generation of the STOP RAMP signal, although controlled by portions of tuning system 23 outside of microprocessor 41, are included in the flow chart shown in FIGS. 4a, 4b and 4c.

When the receiver is turned on, the memory locations of memory 43 corresponding to channel 2 and the memory locations of memory 37 corresponding to the highest magnitude in the tuning range for channel 2, i.e., 2+, are addressed and an upward search for the presence of an acceptable picture carrier for channel 2 is initiated (program steps 00 through 10). As soon as any carrier is detected, as indicated by the presence of an AFT VALID signal, a STOP RAMP signal is generated. If the carrier is a picture carrier and is of sufficient amplitude, as indicated by the presence of both the SYNC VALID and AGC VALID signals, channel 2 is an acceptable channel and the tuning sequence is completed. However, if the carrier is not a picture carrier, as indicated by the absence of a SYNC VALID signal, or the carrier detected has insufficient amplitude, indicated by the absence of an AGC VALID signal, the upward search is reinitiated until a picture carrier having a sufficient amplitude is located. As long as no carrier is detected, as indicated by the absence of an AFT VALID signal, the memory locations of memories 43 and 37 are successively addressed in the order of increasing channel numbers whenever the magnitude of the tuning voltage exceeds the magnitude of a presently generated upper boundary voltage and the magnitude of the tuning voltage is thereafter increased in interative fashion (program steps 11 through 17). In this operation, whenever the channel number of the first channel in the next band (in the order of increasing channel numbers) is reached, the address for tuning voltage boundary memory 37 is increased by one so as to skip over the lower boundary voltage for the lowest channel in the next band (program steps 15 and 16). In other words, during upward searches the lower boundary voltage (7−, 14− and 2− for the lowest number channels 7, 14 and 2) in each band is skipped. The operation of addressing successive memory locations of memories 43 and 37 and causing the magnitude of the tuning voltage to increase continues until a carrier is detected. When a carrier is detected, if it is a picture carrier and its amplitude is sufficient, the tuning sequence is completed (program steps 18, 19 and 20). If the carrier detected is not a picture carrier or its amplitude is not sufficient, the search for another carrier is continued.

Once a tuning sequence has been completed, i.e., an acceptable channel has been located, no action is taken unless UPPB 33 or DNPB 35 is depressed causing microprocessor 41 to generate an UP signal or a DN signal, respectively (program step 21). If the UPPB 33 has been depressed and tuning system 23 was previously set to ramp in the upward direction, as indicated by the UP RAMP signal (program step 22), an upward search, as described above, is initiated. If UPPB 33 has been depressed and tuning system 23 was previously set to ramp in the downward direction, as indicated by the DN RAMP signal (program step 22), the address for tuning voltage boundary memory 37 is increased by one (program step 23). If the latter were not done, the boundary voltage then generated would be the lower boundary voltage for the presently tuned channel rather than the upper boundary voltage. As a result, the boundary voltages generated during the subsequent upward search would be out of step with the generated channel numbers.

If DNPB 35 is depressed, a downward search is initiated. The downward search sequence, indicated by the flow chart shown in FIG. 4c, is similar to the upward search sequence shown in FIGS. 4a and 4b and will not be described in detail. However, it should be noted if a downward search is initiated after the termination of an upward search, the address for tuning voltage boundary memory 37 is decreased by one so as to coordinate the boundary voltages and channel numbers generated during the subsequent search (program steps 24 and 25). In addition, boundary voltages 83+, 13+ and 6+ for channels 83, 13 and 6, respectively, are skipped during a downward search by decreasing the address for tuning voltage boundary memory 37 when the channel number is 83, 13 or 6 (program steps 26 and 27).

Figure 5:
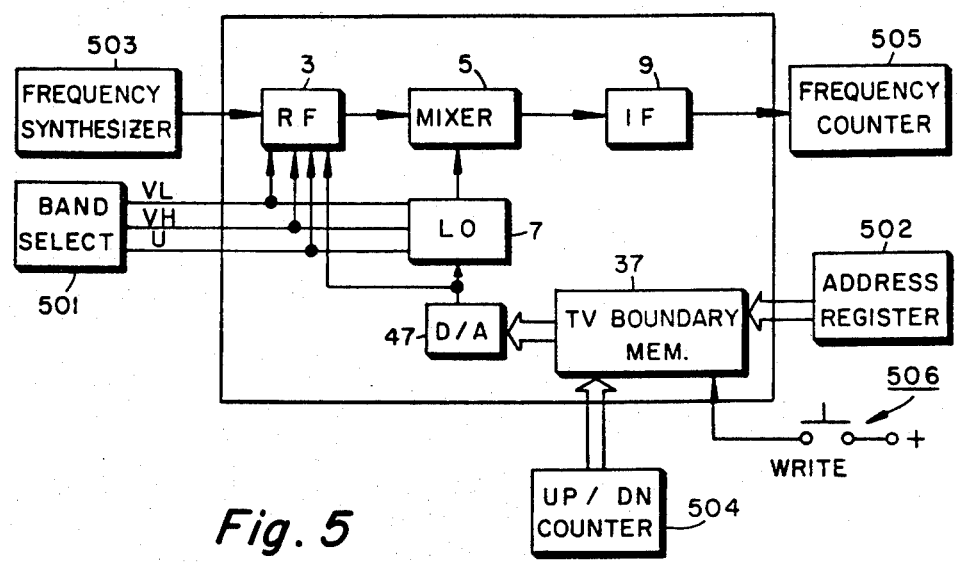
FIGS. 5 and 6 show in block diagram form apparatus for programming of a boundary voltage memory employed in the tuning system of FIGS. 1, 1a, 1b and 1c.

Since the voltages stored in memory 37 are only utilized for displaying channel numbers, they need not be as precise as voltages stored in a memory of a tuning system of the voltage synthesizer type utilized for tuning a receiver. Nevertheless, at the present state of the art, it is difficult to specify the tuning voltage characteristics for a large number of varactor controlled tuners within predetermined limits even for displaying channel numbers. Therefore, it is desirable that the receiver manufacturer program the information in memory 37 so that the stored boundary voltages correspond to the tuning voltage characteristics of the particular local oscillator and RF portion for which they are intended. For this purpose, it is desirable that memory 37 be a PROM. The binary signals representing the boundary voltages may be entered in memory 37 utilizing the arrangement shown in FIG. 5. In the arrangement of FIG. 5, the output of D/A converter 47 is coupled to the tuning voltage input of RF unit 3 and local oscillator 7. The appropriate band selection signals are externally generated by a band selection control unit 501. Binary signals representing the address of the memory locations of memory 37 are externally generated by an address register 502. In addition, test equipment including a frequency synthesizer 503, an up/down counter 504, a frequency counter 505 and a write push button 507 is connected to various portions of the receiver as shown in FIG. 5. With this arrangement, the following setup procedures may be employed to store the binary signals representing the boundary voltages.

(1) Address the memory location in which the boundary voltage is to be stored.

(2) Set frequency synthesizer 503 to the frequency corresponding to the boundary voltage.

(3) Change the contents of up/down counter 504 until the 45.75 MHz is indicated by frequency counter 505.

(4) Depress write push button 507 to enter the binary signals generated by up/down counter 504.

In this arrangement since D/A converter 47 employed during normal operation is employed during setup, the errors of D/A converter 47 are accounted for by the set-up procedure.

Figure 6:
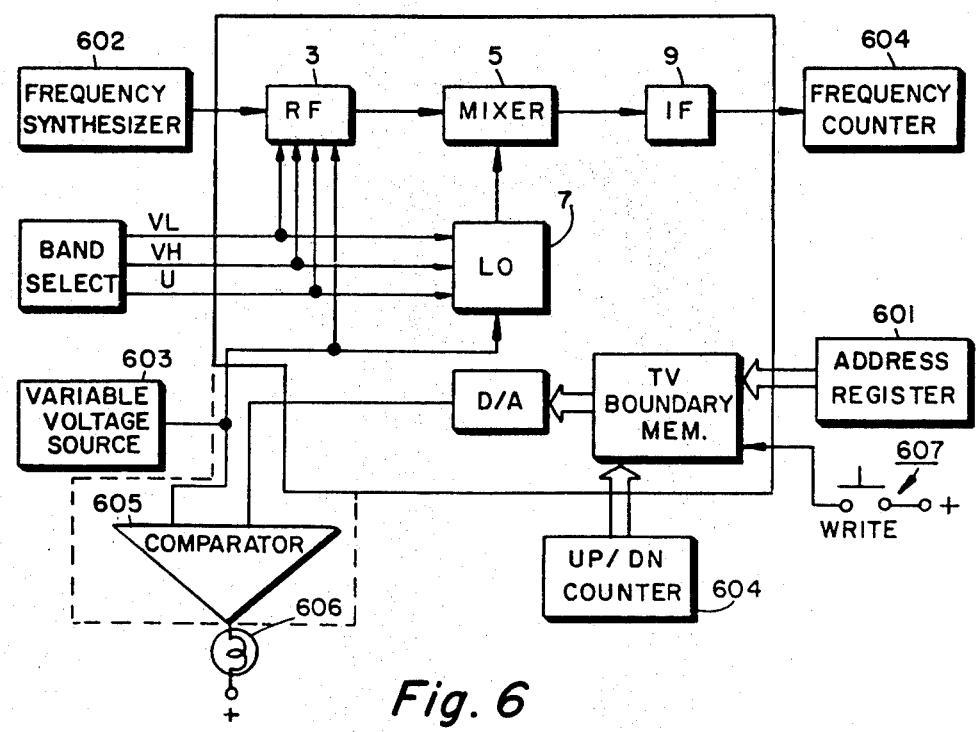

Another arrangement for programming memory 47 is shown in FIG. 6. With this arrangement, the following set-up procedure may be employed by means of address register 601.

(1) Address the memory location in which the boundary voltage is to be stored.

(2) Set frequency synthesizer 602 to the frequency corresponding to the boundary voltage.

(3) Adjust variable voltage sorce 603 until frequency counter 604 indicates 45.75 MHz.

(4) Change the contents of up/down counter 604 until a comparator 605 indicates a state change by means of, for example, a lamp 606 coupled to its output.

(5) Press write push button 607 to enter the binary signals generated by up/down counter 604.

If comparators 49 and 55 are included within a single integrated circuit, their offset voltage characteristics will tend to be similar. Therefore, it may be desirable to employ one of voltage comparators 49 and 55 as comparator 605 so that their offset voltage characteristics are accounted for during setup.

Figure 1C:
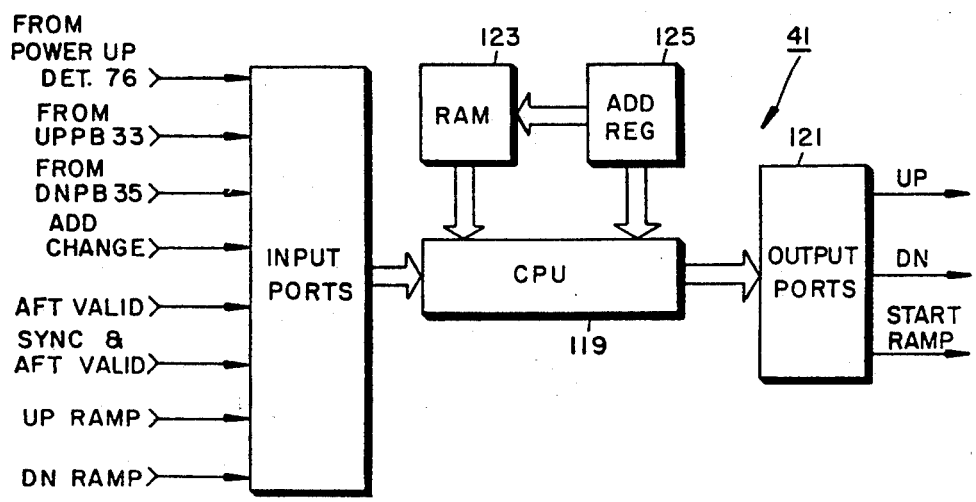
Figure 1B:
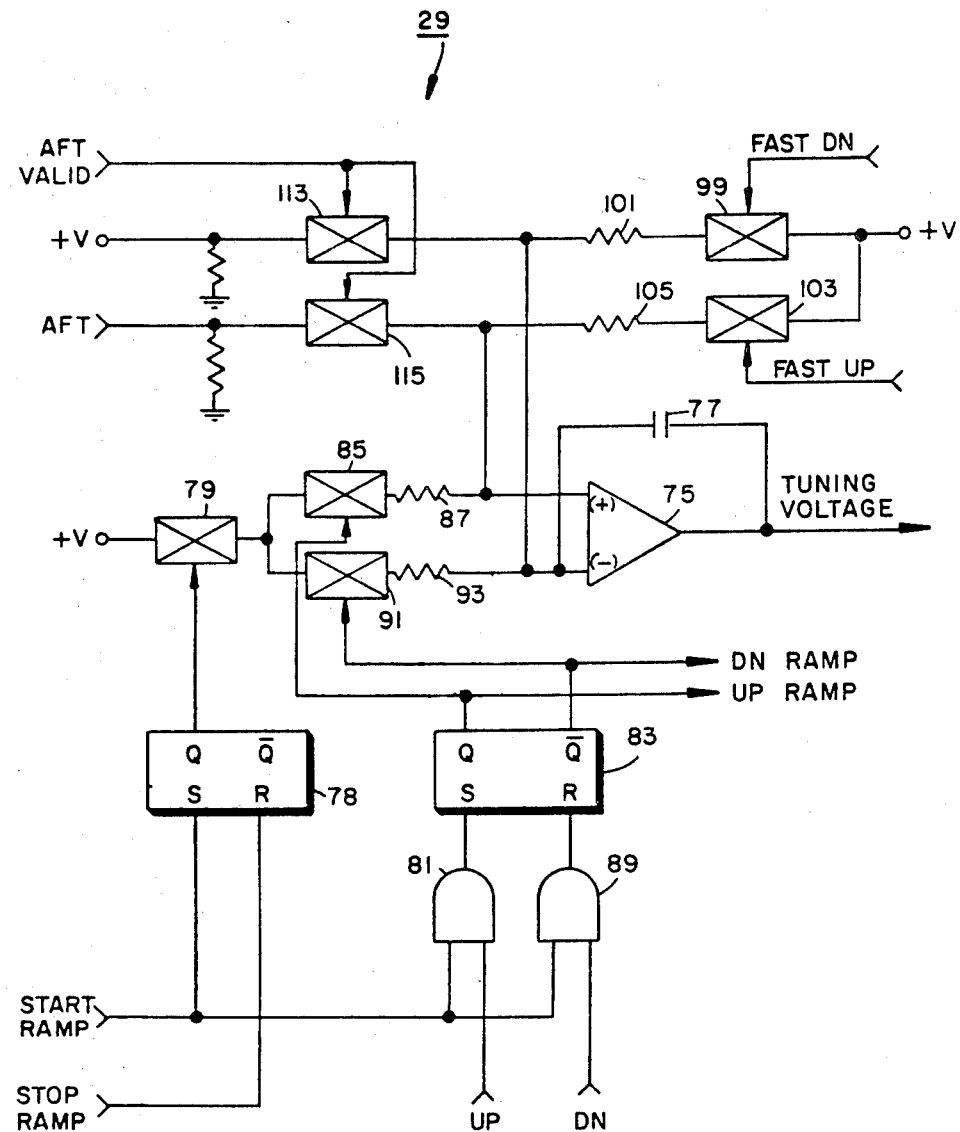
Figure 7:
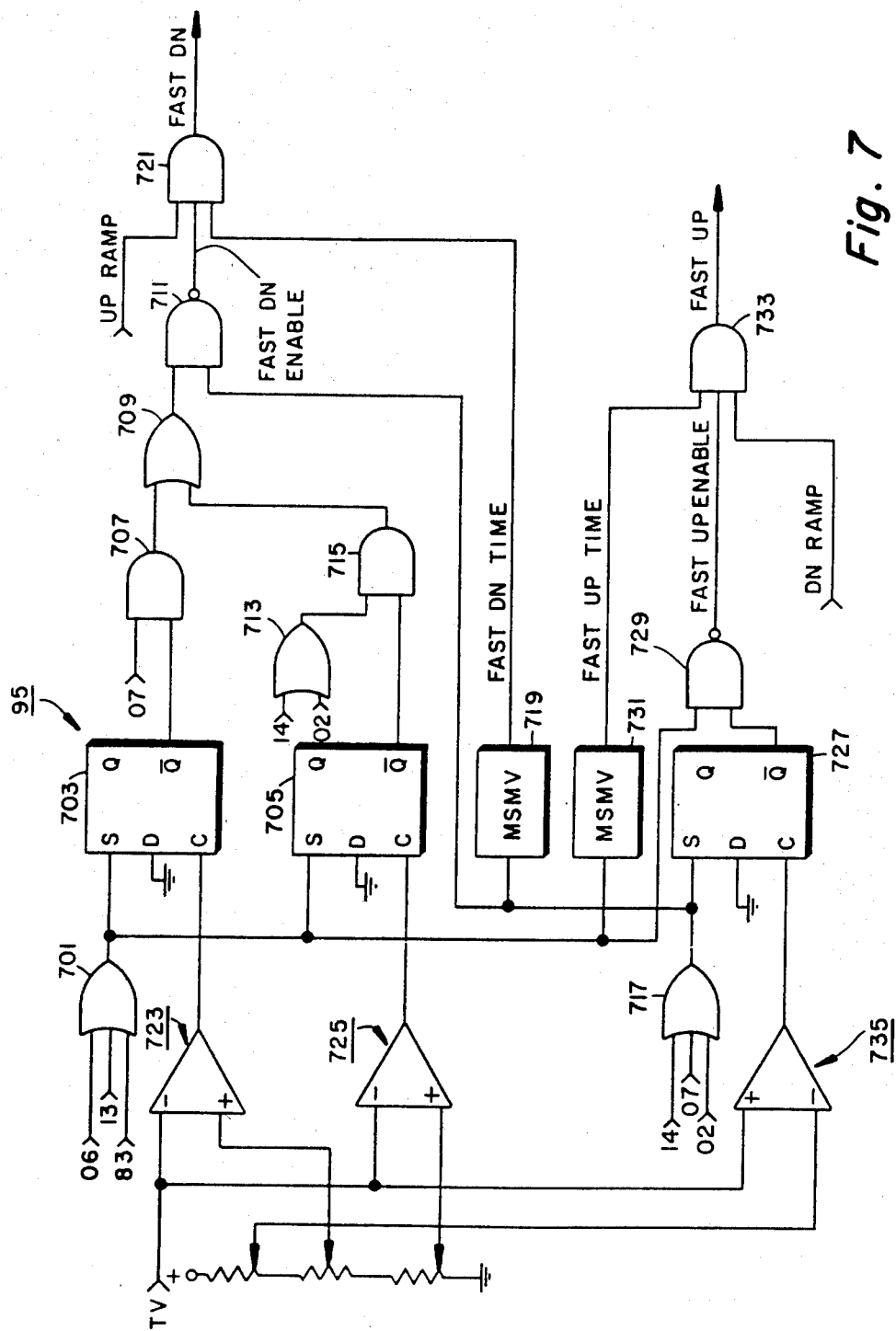
FIGS. 7 and 8 show in logic diagram form implementations of portions of the tuning system of FIGS. 1, 1a, 1b and 1c including a carrier detection circuit constructed in accordance with the present invention.

FIG. 7 shows a logic implementation of fast up/down control unit 95 (shown in block diagram form in FIG. 1). During an upward search, whenever binary signals representing the channel number of the last channel in a band, i.e., channel number 06, 13 or 83, are generated by channel number memory 43 (of the arrangement shown in FIG. 1), band decoder 61 (of the arrangement shown in FIG. 1) generates a signal representing the occurrence. In response, an OR gate 701 couples a high level logic signal to the S (Set) inputs of D (Data) FFs 703 and 705 thereby causing low level logic signals to be developed at their $\overline{Q}$ outputs. As soon as binary signals representing the channel number of the first channel in the next band, i.e., channel number 07, 14 or 02, are generated, a high level FAST DN ENABLE logic signal is generated by the logic configuration including logic gates 707, 709, 711, 713, 715 and 717. At the same time, OR gate 717 generates a high level logic signal which triggers a monostable multivibrator (MSMV) 719. MSMV 719 generates a positive-going FAST DN TIME pulse which has a duration sufficiently long for the fast down ramping interval to be completed. In response to the UP RAMP signal generated by S-R FF 83 (of the arrangement shown in FIG. 1b) and the FAST DN ENABLE and FAST DN TIME signals, an AND gate 721 generates a high level FAST DN signal.

The FAST DN signal terminates when the tuning voltage has a magnitude substantially equal to the lowest magnitude of the tuning voltage range of the lowest channel in the next band. A comparator 723 determines when the tuning voltage has a magnitude corresponding to the beginning, in the upward direction, of the tuning voltage range for channel 7. When the beginning of the tuning voltage range for channel 7 is reached, a high level logic signal is coupled to the C (Clock) input of D FF 703. As a result, since the D input of D FF 703 is coupled to signal ground, D FF 703 is reset causing a high level logic signal to be developed at its $\overline{Q}$ output. In response, by means of logic gates 707, 709 and 711, the FAST DN ENABLE signal becomes a low logic level, and by means of AND gate 721, the high level FAST DN signal is terminated (i.e., becomes a low logic level).

Assuming that the magnitudes at the beginnings of the tuning voltage ranges, in th upward scanning direction, for channels 2 and 14 are approximately the same (as shown in FIG. 2), a single comparator 725 may be used to determine when the tuning voltage has a magnitude corresponding to the beginning of the tuning voltage ranges for channels 2 and 14. When the beginnings of the tuning voltage ranges for channels 2 and 7 are reached, D FF 705 is reset and by means of logic gates 713, 715, 709 and 711 the FAST DN ENABLE signal becomes a low logic level, and by means of AND gate 711 the high level FAST DN signal is terminated (i.e., becomes a low logic level).

During a downward search, by means of OR gate 717 a D FF 727 is set when the binary signals representing the lowest channel number, i.e., channel number 02, 07 or 14, in a band are generated. As soon as binary signals representing the first channel number in the next band, i.e., channel number 83, 06 or 13, are generated, an AND gate 729 generates a high logic level FAST UP ENABLE signal. At the same time, MSMV 731 is tirggered by means of OR gate 701 to generate a high logic level FAST UP TIME pulse which has a duration sufficiently long for fast down ramping to be completed. An AND gate 733, in response to the FAST UP ENABLE signal, FAST UP TIME pulse and DN RAMP signal, generates a high level FAST UP signal. When the tuning voltage has a magnitude corresponding to the beginning of the tuning ranges for the highest channels in the next bands, assuming that these magnitudes are approximately the same (as shown in FIG. 2), a comparator 735 causes D FF 727 to be reset. As a result, the high logic level FAST UP ENABLE and FAST UP signals are terminated.

While the threshold voltages for comparators 723, 725 and 735 of the implementation of control unit 95 shown in FIG. 7 are derived from a resistive divider, it is noted that they may be derived by addressing corresponding memory locations of TV boundary memory 37 during the fast up and fast down ramping intervals.

Figure 8:
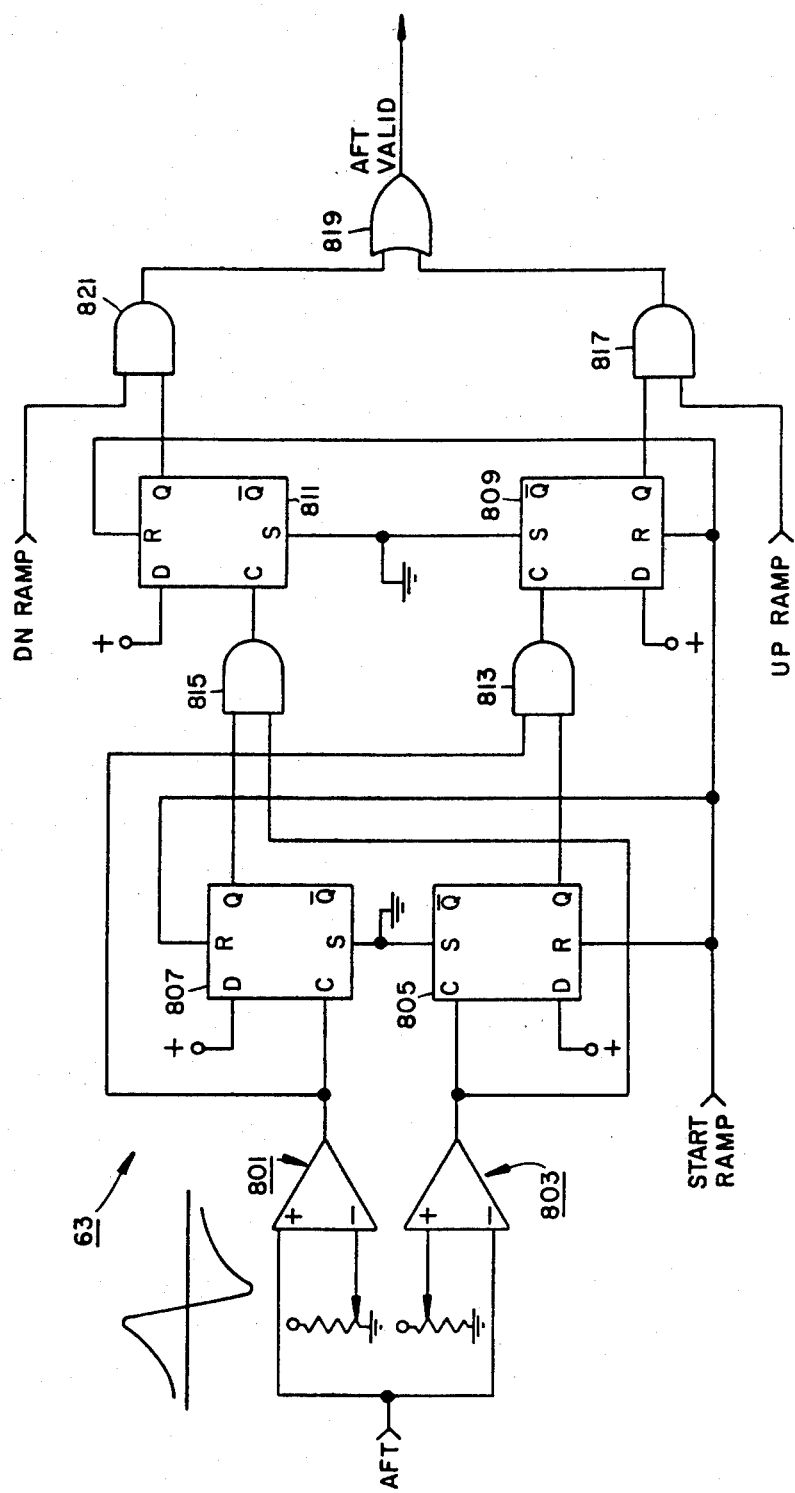

An implementation of AFT comparator 63 shown in block diagram form in FIG. 1c is shown in FIG. 8. AFT comparator 63 includes a comparator 801 for detecting a predetermined voltage corresponding to the positive "hump" of the AFT voltage and a comparator 803 for detecting a predetermined voltage corresponding to the negative "hump" of the AFT voltage. The remaining logic portion of AFT comparator 63 detects the sequence of the "humps" of the AFT voltage to determine whether the AFT voltage is in its control range, i.e., the portion between the humps, thereby indicating that a carrier has a frequency near enough to 45.75 MHz so that normal ramping may be stopped. For this purpose, the logic portion of AFT comparator 63 is arranged so that: when the frequency of the local oscillator is being increased, an AFT VALID signal is only generated when a positive hump is detected and then a negative hump; and that when the frequency of the local oscillator signal is being decreased, an AFT VALID signal is only generated when a negative hump is detected and then a positive hump. The AFT VALID signal is generated when the second of the two humps is detected. The logic portion of AFT comparator 63 is arranged so that after a carrier has been detected, the first hump detected thereafter is disregarded in a subsequent sequence detection operation. This is done since, in this situation, when ramping is again initiated, the first hump detected is associated with the previously detected carrier rather than the next one.

The logic portion of AFT comparator 63 includes four D FFs 805, 807, 809 and 811 which are reset in response to a START RAMP signal. Assuming that the ramping direction is downward, the first hump detected will be the positive hump associated with the previously detected carrier. Accordingly, D FF 805 is set and an AND gate 813 is enabled. The next hump detected will be the negative hump associated with the next carrier. Accordingly, D FF 807 is set and AND gate 815 is enabled. In addition, since AND gate 813 was already enabled, D FF 809 is set. However, since an AND gate 817 is disabled due to the absence of a high logic level UP RAMP signal, an AFT VALID signal is not generated by an OR gate 819.

The next hump detected will be the positive hump associated with the next carrier. Accordingly, since AND gate 815 was already enabled by set D FF 807, D FF 811 is set. Since an AND gate 821 is enabled by a high logic level DN RAMP signal, an AFT VALID signal is generated by OR gate 819.

Thus, in the downward ramping direction, the first positive hump is disregarded and an AFT VALID signal is generated after a negative hump-positive hump sequence. In the upward ramping direction, the logic portion of AFT comparator 63 operates in a similar fashion to disregard the first negative hump and generate an AFT VALID signal after a positive hump-negative hump sequence.

Figure 9:
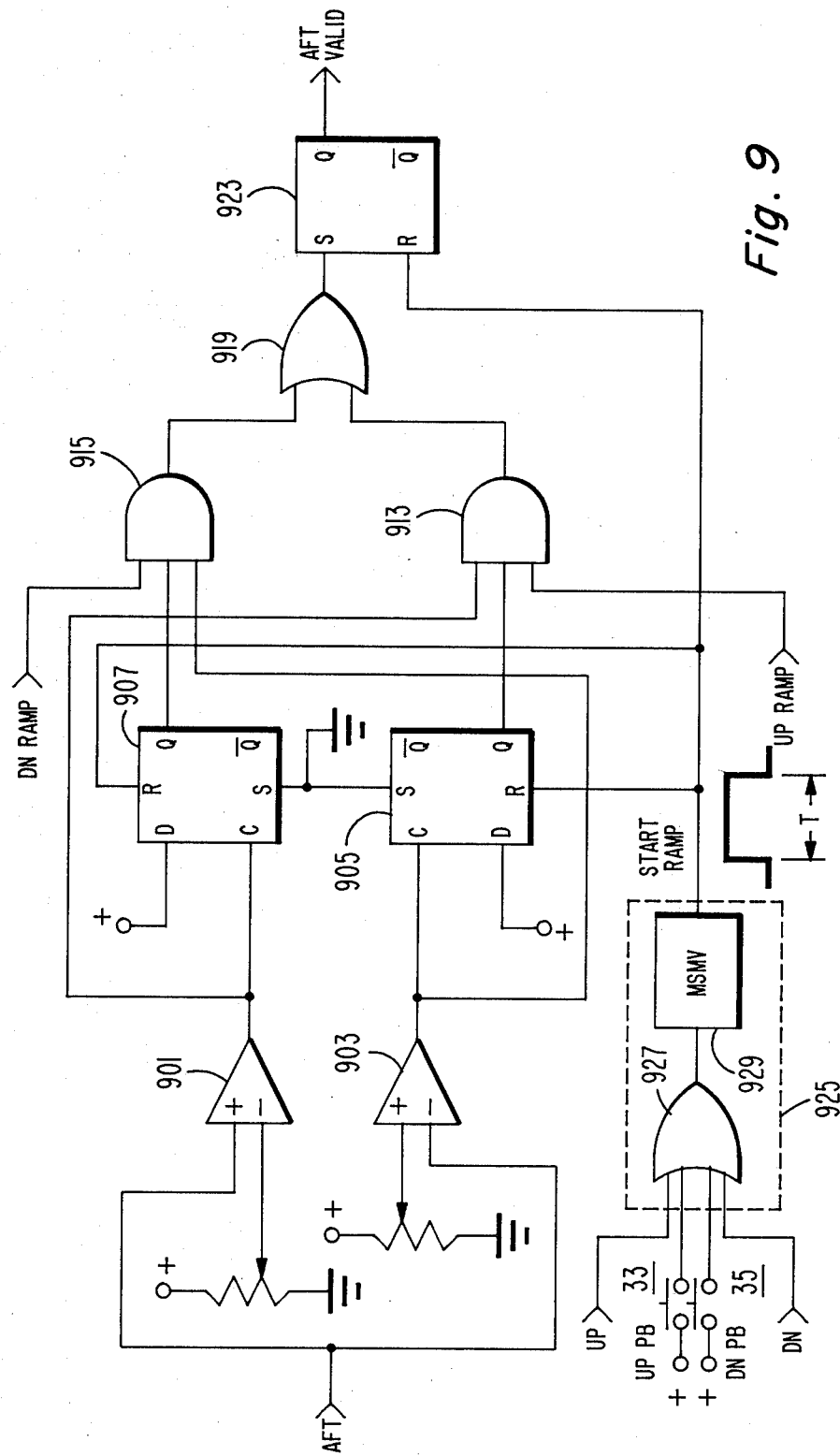
FIG. 9 shows in logic diagram form an alternate implementation of a carrier detector constructed in accordance with the present invention which is an alternate form of the implementation shown in FIG. 8.

An alternate form of the implementation of carrier detector 63 shown in FIG. 8 is shown in FIG. 9. For the purpose of comparison, corresponding portions are identified with reference numbers having the same tens and units digits. It will be noted that the implementation shown in FIG. 9 has one less flip-flop and two less AND gates. Specifically, with respect to the flip-flops, FF 811 and 809 of the implementation shown in FIG. 8 have been eliminated and in the implementation shown in FIG. 9 a FF 923 has been added. With respect to the AND gates, AND gates 817 and 821 of the implementation shown in FIG. 8 have been eliminated and in the implementation shown in FIG. 9, the DN RAMP and UP RAMP signals are coupled to AND gates 915 and 913, respectively. It will be appreciated that the implementation shown in FIG. 9 is preferable since it has fewer components.

The logic portion of AFT comparator 63 includes two data (D) type FF 905 and 907 and a set-reset (S-R) FF 923. S-R FF 923 may also be a D FF with its D input coupled to receive a logic high and its C input coupled to the output of OR gate 919. Flip-flops 905, 907 and 909 are all reset in response to the START RAMP pulse generated when ramping is initiated. Assuming that the ramping direction is downward, and a carrier is present, the first hump encountered will be a negative hump. Accordingly, the output of comparator 903 undergoes a transition from a logic low or "0" level to a logic high or "1" level. In response to the transition, D FF 905 is set. Since the DN RAMP signal is at a logic high level and the Q output of D FF 905 is now also at a high level, an AND gate 913 is enabled. The next hump encountered will be the positive hump associated with the carrier. Accordingly, the output of comparator 901 undergoes a transition from a logic low level to a logic high level. Since AND gate 913 is enabled, this latter transition is coupled through AND gate 913 and an OR gate 919 to the set (S) input of S-R FF 923. In response, S-R FF 923 is set and its Q output becomes a high logic level to thereby generate the AFT VALID signal.

Assuming that the ramping direction is upward and a carrier is present, the first hump encountered will be a positive hump. Accordingly, the output of comparator 901 undergoes a transition from a logic low or "0" level to a logic high or "1" level. In response to the transition, D FF 907 is set. Since the UP RAMP signal is at a logic high level and the Q output of D FF 902 is now also at a high level, an AND gate 915 is enabled. The next hump encountered will be the negative hump associated with the carrier. Accordingly, the output of comparator 903 undergoes a transition from a logic low level to a logic high level. Since AND gate 915 is enabled, this latter transition is coupled through AND gate 915 and an OR gate 919 to the set (S) input of S-R FF 923. In response, S-R FF 923 is set and its Q output becomes a high logic level to thereby generate the AFT VALID signal.

It will be noted that as in the implementation shown in FIG. 8, in the implementation shown in FIG. 9, for the upward sweep direction in the IF range, a positive hump-negative hump sequence must be produced before an AFT VALID signal is generated; and for the downward sweep direction in the IF range, the negative hump-positive hump sequence must be produced before an AFT VALID signal is generated. Therefore, after a carrier has been detected and ramping is again initiated, the first hump encountered (which is the second hump associated with the previously detected carrier) is properly ignored.

As earlier indicated, the START RAMP pulse which resets FFs 805, 807, 809 and 811 of the implementation shown in FIG. 8 on FFs 905, 907 and 923 of the implementation of FIG. 9 has a predetermined time duration. This duration is independent of the length of time UPPB 33 and DNPB 35 are operated. This is symbolically indicated in FIG. 9 by the arrangement identified within dotted line 925 including an OR gate 927 and a monostable multivibrator (MSMV) 929. In response to the closure of either of UPPB 33 or DNPB 35, a transition from a logic "0" to a logic "1" is produced at the output of OR gate 927. In response to the transition, MSMV 929 is triggered to produce the START RAMP pulse which has a duration determined by the time constant of MSMV 929 and which is therefore independent of the length of time UPPB 33 or DNPB 35 is held closed by a user. The UP and DN pulses generated, at the times indicated as indicated in the flow chart of FIGS. 4a, b and c, are also applied to inputs of OR gate 927 so that the START RAMP pulse is generated in response to these pulses also.

While the portion within dotted line 925 is symbolically indicated in discrete form, as indicated in FIG. 1, it is contemplated that microprocessor 41 performs the same function, namely of generating a START RAMP pulse of the predetermined duration when UPPB 33 or DNPB 35 is closed by a user or the UP or DN pulses are generated.

Figure 10:
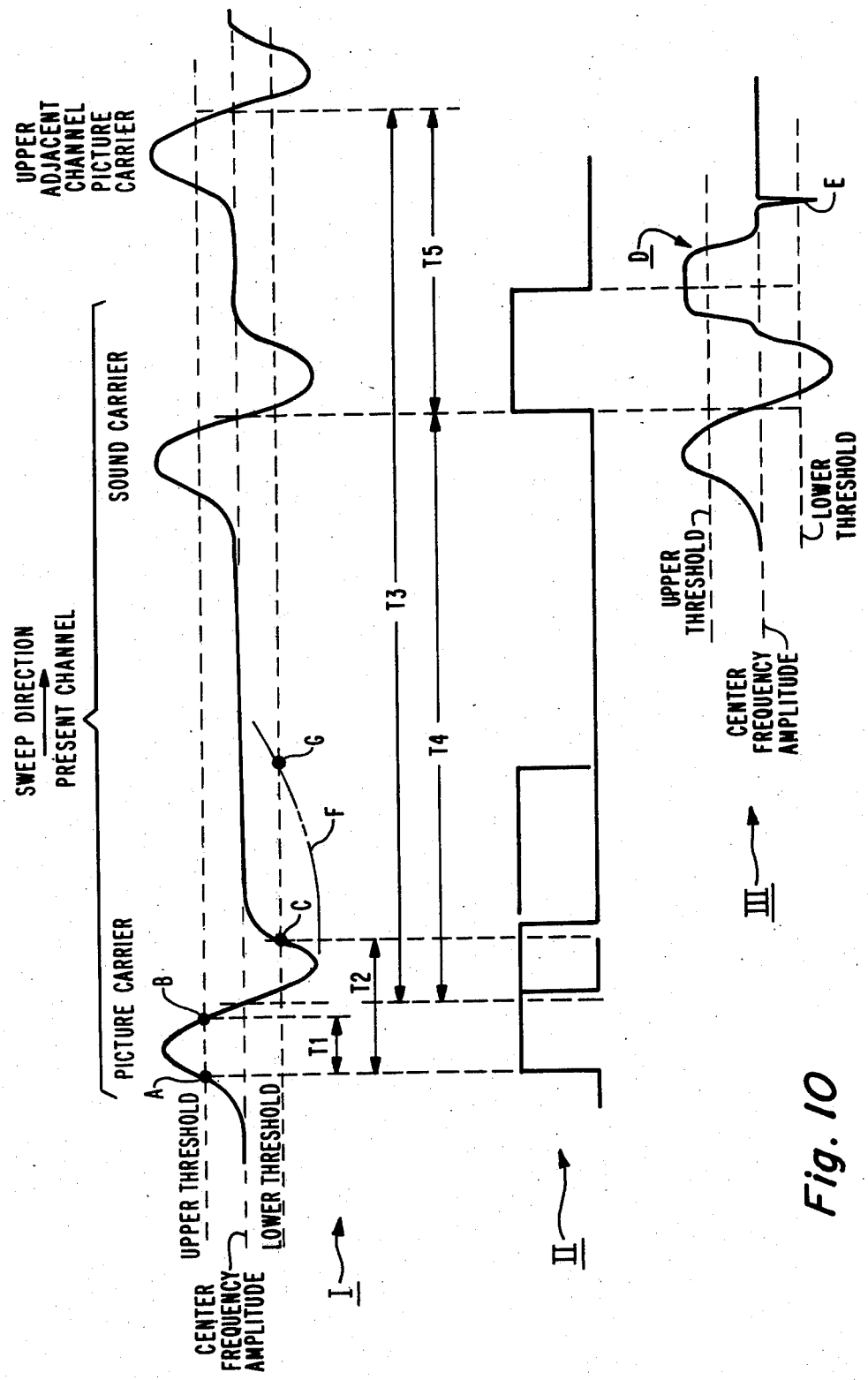
FIG. 10 shows graphical representations of waveforms useful in facilitating the operation of the carrier detection circuit shown in FIGS. 8 and 9.

The significance of providing apparatus for causing the START RAMP pulse to have a predetermined duration independent of the length of time UPPB 33 or DNPB 35 is operated will be explained in relation to the implementation shown in FIG. 9 and waveforms I, II and III shown in FIG. 10. In FIG. 10, waveform I represents the AFT characteristic for two adjacent channels in the IF range during an upward sweep. Although the following description is directed to a sweep in the upward direction, it will be understood that by analogy, it is equally applicable to sweep in the downward direction except, of course, that the discussions with respect to the positive and negative amplitude portions or humps should be interchanged. In addition, while reference is made to portions of the implementation shown in FIG. 9, the same applies to corresponding portions of the implementation shown in FIG. 8.

Ideally, the START RAMP pulse(waveform II) need only have a duration longer than the time T1 required to sweep between points (points A and B) of the positive hump above the upper threshold. This assures that when the sweep is initiated in response to the START RAMP pulse, if the AFT amplitude is caused to be between points A and B, due to noise or other aberration, even though threshold comparator 901 will respond to produce a clock signal for 907, FF 907 will be held reset and the false positive hump will be ignored. Accordingly, even if the START RAMP pulse were to end just after point B was traversed, when the negative hump is detected by threshold comparator 903 and FF 905 is set, the AFT VALID signal will not be generated since the predetermined sequence for the upward sweep of a positive hump followed by a negative hump would not be produced. As a result, the same channel that was previously located and tuned would not again be tuned.

However, practically, it is preferable that the duration of the START RAMP pulse is longer than the time T2 required to sweep from the point (point A) where the positive hump traverses the upper of the positive hump to the point (point C) where the negative hump traverses the lower threshold. This assures that when the sweep is initiated in response to the START RAMP pulse, if the AFT amplitude is caused to be between points A and B and then below the lower threshold, neither amplitude excursion will be detected and, of course, the proper sequence for generating the AFT VALID signal and thereby stopping once again on the same channel will be prevented.

The duration of START RAMP pulse should also have a maximum limit. This maximum duration should be shorter than the time T3 required to sweep between the nearest adjacent channels. If this is not the case, it is possible for FFs 905 and 907 to be held at reset when the sweep reaches the channel adjacent to the presently tuned channel. Accordingly, the adjacent channel would go undetected.

Since sound carriers produce approximately the same AFT signal response, with the same sequence of humps, as picture carriers for each sweep direction and therefore cause the generation of AFT VALID signals, a suitable choice for the duration T of the START RAMP pulse is less than the time T3 required to sweep between the nearest adjacent picture carriers (which are nominally separated by 6 MHz in the United States) and greater than the maximum time required to sweep between a picture carrier and the next sound carrier. For the upward sweep direction, the next sound carrier after a picture for a channel is the sound carrier for the same channel. In the United States, the picture and sound carriers for the same channel are separated by 4.5 MHz. For the downward sweep direction, the next sound carrier after a picture carrier for a channel is the sound carrier for the lower adjacent channel. In the United States, the picture carrier for one channel and the sound carrier for the lower adjacent channel are nominally separated by 1.5 MHz. Since the time T4 to sweep in the upward direction between the picture carrier and sound carrier for the same channel is larger than the time T5 to sweep in the downward direction between a picture carrier of one channel and the sound carrier of the lower adjacent channel, a suitable choice for the minimum duration of the reset pulse is T4. In this manner, the AFT VALID signal will not be generated in response to sound carriers and therefor will not produce erroneous pauses in the sweep which may be disconcerting, as described in greater detail below.

While the above selection is desirable in most signal seeking tuning systems, including those having a bar type channel number display as described below, if the digital type of channel number display described above in which the magnitude of the tuning voltage is compared to boundaries stored in a memory is utilized, a shorter duration for the START RAMP pulse should be selected. This is so because each time a boundary is traversed, the appropriate one of the UP and DN pulses, depending on the sweep direction, and a corresponding START RAMP pulse are generated, as is indicated in the flow charts shown in FIGS. 4a, 4b and 4c. Since the location of the boundaries to the picture carrier is not accurately predictable, the START RAMP pulse should have a relatively short duration compared with the time required to sweep between the picture carriers of adjacent channels. In that case, the sound carriers for adjacent channels can be detected and thereby cause the generation of AFT VALID signals and corresponding pauses in the sweep. However, since the SYNC VALID signal will not be generated for a detected sound carrier, the appropriate one of the UP and DN pulses and resulting START RAMP pulse will be generated. In order not to miss the picture carrier following the sound carrier in upward sweep, the maximum duration of the START RAMP pulse should be shorter than the minimum time T5 required to sweep between a sound carrier of the present channel and the picture carrier for the upper adjacent channel (which carriers are nominally separated by 1.5 MHz in the United States). It should be noted that while the frequency spacing between adjacent picture carriers is not accurately predictable since the received RF carriers for respective channels may be offset in frequency from their nominal or standard broadcast frequencies, e.g., as may be the case in a cable system, the spacing between the picture carrier and the sound carrier for the same channel is accurately predictable even when the RF carriers for respective channels have frequency offsets.

For the reasons discussed below, it has been found that the use of an edge triggered flip-flop, such as a data (D) type flip-flop, as compared with the use of a level triggered flip-flop, such as a set-reset flip-flop, for FFs 905 and 907 tends to reduce the number of erroneously generated AFT VALID signals. In the present tuning system, even if an erroneous AFT VALID signal is generated, an incorrect carrier will not be tuned because the SYNC VALID and AGC VALID signals will not be generated to permanently stop the sweep. However, an erroneous AFT VALID signal will cause the sweep to temporarily pause, which may be manifested by a pause in the changing channel number display and depending on the sweep rate noticeable and possibly disconcerting to users.

Erroneous pauses in the sweep are especially disconcerting, if, rather than the digital type channel number display previously discussed, a tuning bar type of channel number display, e.g., as disclosed in U.S. Pat. No. 4,241,361, is utilized. In a bar type channel number display system, a vertical bar is produced in the image which has its horizontal position determined by the magnitude of the tuning voltage. Accordingly, the vertical bar moves horizontally as the sweep progresses. Channels are identified by reference to channel numbers formed on the mask surrounding the screen of the picture tube. Pauses in the sweep manifest themselves as pauses in the movement of the bar.

The manner in which the use of edge triggered flip-flops reduces the possibility of the erroneous generation of AFT VALID signals will be explained with reference to waveform III of FIG. 10, which represents the AFT signal generated as a sound carrier is encountered during a sweep between the picture carriers of two channels. The sound carrier is the sound carrier of the present channel.

It has been found that when the picture carrier of the previously detected and tuned channel is modulated in certain ways, e.g., so as to produce a substantially white image, a relatively long duration pulse, as indicated by D, may occur immediately after the sound carrier. If the START RAMP pulse which resets FF 905 and 907 ends before pulse D ends, comparator 901 will produce a high logic level at its output. If FF 907 were a level triggered flip-flop, it would be set. If a negative going noise pulse, as indicated by E occurred after pulse D, comparator 903 would respond and FF 905 would be set. As a result, an AFT VALID signal would be generated. However, in the present arrangement since FF 907 requires a transition or edge to be triggered, it will not respond to the level of pulse D. Accordingly, if noise pulse E occurs, the AFT VALID signal will not be erroneously generated.

When the sound carrier is detected, in response to the absence of the SYNC VALID signal, a START RAMP pulse will be generated. Accordingly, it would be thought that if the duration T of the START RAMP pulse is made long enough, even if FFs 905 and 907 were level triggered flip-flops, they would be held reset and therefore the AFT VALID signal would not be generated in response to pulses D and E. However, it has been found that under certain conditions, the time required to sweep past the point at which the negative amplitude portion of the AFT signal rises above the lower threshold may be larger than T2 as indicated by broken line portion F which rises above the lower threshold at point G. Accordingly, it is desirable to make the duration T of the START RAMP pulse as long as possible. For the reasons stated above, the duration of the RAMP START pulse cannot be so long as to prevent the detection of the positive and negative amplitude portions of the AFT signal associated with the adjacent channel. Since the RF carriers received, e.g., from cable networks, corresponding to channels may be offset in frequency, from the respective nominal or standard broadcast values, the position of the adjacent channel in time is not absolutely predictable. Accordingly, the maximum duration of the START RAMP pulse is restricted. Thus, it is particularly desirable that each of FF 905 and 907 be edge triggered flip-flops to prevent the generation of erroneous AFT VALID signals due to pulses such as D and E.

The following equation expresses how the predetermined duration T of the START RAMP pulse is calculated:

$$T = F/RS \qquad (1)$$

where F is the frequency separation, in Hz, between amplitude points of the AFT signal, e.g., such as A, B or C, corresponding to the time duration T, R is the ramp speed, in volts/sec, of the tuning voltage and S is the slope, in Hz/volts, of the tuning voltage characteristic. When calculating the minimum value of T, R and S should be at their worst case maximum values and F should be at its minimum value. Conversely, when calculating the maximum value of T, the values of R and S should be at their worst case minimum values and F should be at its maximum value.

In making the above calculation, it should be that the values of R and S depend on the band which is being swept. Moreover, if the value of R depends on the sweep direction, this should be taken into account. Finally, in determining the value of F, it should not be assumed that the AFT characteristic is symmetrical about its center frequency, and accordingly, the sweep direction should be considered.

It has been found that the present carrier detector embodied in the arrangements shown in FIGS. 8 and 9 are inherently advantageous in several respects. First, while a variety of carrier detectors employing threshold comparators responsive to the amplitude of discriminator signal for determining when a carrier is present are known, these arrangements are particularly sensitive to variations associated with the comparators. On the other hand, in the present arrangement, the threshold comparators are merely employed to generate signals indicative of the presence of first and second amplitude "humps" which are thereafter utilized to evaluate the sequence in which the "humps" are generated. As such, variations associated with the comparators are not particularly critical. Second, it has been found that the present arrangement inherently rejects or prevents tuning of undesired signals at image frequencies. Image frequencies are those which are located symmetrically from desired frequencies on the opposite side of the respective local oscillator frequencies and which are undesirably generated as part of the mixing process and imperfect filtering. The frequency of an image signal changes in the opposite sense to the frequency of the desired carrier. For example, while the frequency of a desired carrier increases in frequency as the frequency of the local oscillator is swept upward, the frequency of the image signal decreases as the frequency of the local oscillator is swept upward. Thus, since the present carrier detector is responsive to a predetermined sequence related in a predetermined manner to the direction of sweep, it has been found that a signal indicative of the presence of an image signal will not be erroneously generated.

Since the portions of automatic channel detection circuit 31 for evaluating the synchronization and AGC signals are well known in the signal seeking art, no detailed description of these components of the present system will be provided.

While the carrier detector arrangement has been described with reference to a specific sweep type tuning system with a digital type channel number display, it has general application in other sweep type tuning systems with different types of channel indicators, e.g., such as the aforementioned bar type. This and other modifications are intended to be included within the scope of the present invention as defined by the following claims.

What is claimed is:

1. In a tuning system for a receiver, apparatus comprising:

tuner means for tuning a plurality of RF carriers corresponding to respective channels in a predetermined frequency range to generate an IF signal having at least one carrier modulated in accordance with an information bearing signal with a nominal frequency value;

switch means for generating a "switch" signal when operated by a user;

sweep means responsive to said "switch" signal for causing said tuner means to tune said RF carriers to thereby sweep said predetermined frequency range in a predetermined direction at a predetermined sweep rate, the time required to sweep between the closest pair of adjacent channels having a predetermined minimum duration;

discriminator means responsive to said IF signal for generating a discriminator signal as said predetermined frequency range is swept having a first amplitude portion when the frequency of said IF signal is less than said nominal frequency value and a second amplitude portion when the frequency of said IF signal is greater than said nominal frequency value, said discriminator means generating said first and second amplitude portions in a predetermined sequence when said predetermined range is swept in said predetermined direction and the tuned RF carrier correctly corresponds to one of said channels, the time required to sweep through the first one of said first and second amplitude portions encountered at said predetermined sweep having a predetermined maximum duration;

channel presence detector for detecting when the tuned RF carrier for the selected carrier is correct including sequence detector means responsive to said discriminator signal for detecting the sequence in which said first and second amplitude portions are generated and for generating a "presence indicating" signal when said first and second amplitude portions are generated in said predetermined sequence and said sweep is in said predetermined direction; and pulse forming means responsive to the operation of said switch means for generating a reset pulse having a predetermined duration independent of the length of time said switch is operated by the user which is longer than said maximum duration of the time required to sweep through said first one of said first and second amplitude portions encountered and shorter than said minimum duration of the time required to sweep between the closest pair of adjacent channels;

said sequence detector means including reset means responsive to said reset pulse for resetting said sequence detector and thereby ending said "presence indicating" signal and maintaining said sequence detector reset during the time duration of said reset pulse.

2. The apparatus recited in claim 1 wherein:
the time required to sweep through both of said first and second amplitude portions at said predetermined rate has a predetermined maximum duration; and said predetermined duration of said reset pulse is longer than said maximum duration of the time required to sweep through both of said first and second amplitude portions.

3. The apparatus recited in claim 1 wherein:
said switch means includes first and second switches each operable by a user;

means for generating a first direction signal when said first switch is operated and for generating a second direction signal when said second switch is operated;

said sweep means includes means responsive to said first direction signal for causing said tuner means to sweep said predetermined frequency range in a first direction and at said predetermined sweep rate; and means responsive to said second direction signal for causing said tuner means to sweep said predetermined frequency range in a second direction, opposite the first direction, at said predetermined sweep rate;

said discriminator means generates said first amplitude portion and then said second amplitude portion in sequence when said predetermined range is swept in said first direction and the tuned RF carrier correctly corresponds to one of said channels, said discriminator means generates said second amplitude portion and then said first amplitude portion in sequence when said predetermined range is swept in said second direction and the tuned RF carrier correctly corresponds to one of said channels, the time required to sweep through said first amplitude portion when said predetermined range is swept in said first direction at said predetermined sweep rate having a first predetermined maximum duration, the time required to sweep through said second amplitude portion when said predetermined range is swept in said second direction having a second predetermined maximum duration;

said sequence detector means generates said "presence indicating" signal when said first amplitude portion and then said second amplitude portion are generated in sequence and said first direction signal has been generated, said sequence detector means generates said "presence indicating" signal when said second amplitude portion and then said first amplitude portion are generated in sequence and said second direction signal has been generated; and said pulse forming means is responsive to the operation of either one of said first and second switch means for generating said reset pulse, said predetermined duration of said reset pulse being longer than the greater one of said first and second maximum durations of said first and second amplitude portions, respectively, and shorter than said minimum duration between the closest pair of adjacent channels.

4. The apparatus recited in claim 3 wherein:
the time required to sweep through both of said first and second amplitude portions when said predetermined range is swept in said first direction at said predetermined sweep rate having a third predetermined maximum duration, the time required to sweep through both of said second and first amplitude portions when said predetermined range is swept in said second direction having a fourth predetermined maximum duration; and said predetermined duration of said reset pulse being longer than the greater one of said third and fourth maximum durations of the times required to sweep through both of said first and second amplitude portions when said predetermined range is swept in said first and second directions, respectively.

5. The apparatus recited in claim 1, 2, 3 or 4 wherein:
said RF carriers correspond to respective television channels;

said IF signal has a first carrier modulated in accordance with picture information and a second carrier modulated in accordance with sound information;

the time required to sweep from a picture carrier to the sound carrier encountered next while sweeping having a predetermined maximum duration;

said discriminator means generates said first and second amplitude portions in said predetermined sequence in response to each one of said first and second carriers; and said predetermined duration of said reset pulse is longer than said maximum duration of the time required to sweep the closest picture from a picture carrier to the sound carrier encountered next while sweeping.

6. The apparatus recited in claim 3 wherein:
said sequence detector means includes first amplitude comparator means responsive to said discriminator signal for producing a first transition to a first logic signal when said first amplitude portion traverses a first amplitude level; second amplitude comparator means responsive to said discriminator signal for producing a second transition to a second logic signal when said second amplitude portion traverses a second amplitude level; a first edge-triggered flip-flop for generating and storing a third logic signal in response to said first transition; a second edge-triggered flip-flop for generating and storing a fourth logic signal in response to said second transition; first "and" means responsive to the coincidence of said second direction signal and said second and third logic signals for generating a fifth logic signal; second "and" means responsive to the coincidence of said first direction signal and said first and fourth logic signals for generating a sixth logic signal; and "or" means responsive to either of said fifth and sixth logic signals for generating said "presence indicating" signal.

7. The apparatus recited in claim 3 wherein:
said sequence detector means includes first amplitude comparator means responsive to said discriminator signal for generating a first logic signal when said first amplitude portion traverses a first amplitude level; second amplitude comparator means responsive to said discriminator signal for generating a second logic signal when said second amplitude portion traverses a second amplitude level; first storing means for generating and storing a third logic signal in response to said first logic signal; second storing means for generating and storing a fourth logic signal in response to said second logic signal; first "and" means responsive to the coincidence of said second direction signal and said second and third logic signals for generating a fifth logic signal; second "and" means responsive to the coincidence of said first direction signal and said first and fourth logic signals for generating a sixth logic signal; and "or" means responsive to either of said fifth and sixth logic signals for generating said "presence indicating" signal.

8. The apparatus recited in claim 7 wherein:
said first storing means comprises a first flip-flop which is set in response to said first logic signal to produce said third logic signal and reset in response to said reset pulse to end said third logic signal; and
said second storing means comprises a second flip-flop which is set in response to said second logic signal to produce said fourth logic signal and reset in response to said reset pulse to end said fourth logic signal.

9. The apparatus recited in claim 8 wherein said first and second flip-flop are edge triggered flip-flops.

10. The apparatus recited in claim 9 wherein said first and second flip-flops are data type flip-flops.

11. The apparatus recited in claim 3 wherein:
said channel presence means includes first comparator means responsive to said information bearing signal for generating a first "valid" signal when said information bearing signal exhibits a predetermined condition;
said sweep means includes stop means for stopping said sweeping in response to the generation of said "presence indicating" signal, and start means for again starting said sweeping after the generation of said "presence indicating" signal if said first "valid" signal is not generated after a predetermined time delay after the generation of said "presence indicating" signal;
said pulse forming means additionally generates said reset pulse after the generation of said "presence indicating" signal if said first "valid" signal is not generated after said predetermined time delay after the generation of said "presence indicating" signal.

12. The apparatus recited in claim 11 wherein:
said means for generating said first and second direction signals includes first means for maintaining said first direction signal after it is generated until said second direction signal is generated and second means for maintaining said second direction signal after it is generated until said second direction signal is generated; and
said sweep means is responsive to said maintained one of first and second direction signals for causing said tuner to sweep in the respective one of said first and second directions after it is again started by said start means.

13. The apparatus recited in claim 12 wherein:
said information bearing signal is a picture carrier modulated with information for producing an image including image synchronization components; and
said first comparator means is responsive to said synchronization components for generating said first "valid" signal when said synchronization component has a predetermined condition.

14. The apparatus recited in claim 13 wherein:
said channel presence means includes strength determining means responsive to said IF signal for generating a "second valid" signal when said IF signal exhibits a predetermined strength;
said start means also again starts said sweeping after the generation of said "presence indicating" signal if said "second valid" signal is not generated after a predetermined time delay after the generation of said "presence indicating" signal; and
said pulse forming means further generates said reset pulse after the generation of said "presence indicating" signal if said "second valid" signal is not generated after said predetermined time delay after the generation of said "presence indicating" signal.

15. The apparatus recited in claim 1, 2, 3 or 4 wherein:
said RF carriers correspond to respective television channels;
said IF signal has a first carrier modulated in accordance with picture information and a second carrier modulated in accordance with sound information;
the time required to sweep from a picture carrier to the sound carrier encountered next while sweeping having a predetermined maximum duration;
said discriminator means generates said first and second amplitude portions in said predetermined sequence in response to each one of said first and second carriers; and
said predetermined duration of said reset pulse is shorter than said maximum duration of the time required to sweep the closest picture from a picture carrier to the sound carrier encountered next while sweeping.

* * * * *